United States Patent
Koo et al.

(10) Patent No.: US 11,508,651 B2
(45) Date of Patent: Nov. 22, 2022

(54) CHIP-ON-FILM PACKAGES AND DISPLAY APPARATUSES INCLUDING THE SAME

(71) Applicant: Samsung Electronics Co., Ltd., Suwon-si (KR)

(72) Inventors: Jungeun Koo, Hwaseong-si (KR); Yechung Chung, Hwaseong-si (KR)

(73) Assignee: Samsung Electronics Co., Ltd.

( * ) Notice: Subject to any disclaimer, the term of this patent is extended or adjusted under 35 U.S.C. 154(b) by 12 days.

(21) Appl. No.: 16/874,120

(22) Filed: May 14, 2020

(65) Prior Publication Data

US 2021/0074622 A1   Mar. 11, 2021

(30) Foreign Application Priority Data

Sep. 10, 2019   (KR) .................. 10-2019-0112367

(51) Int. Cl.
| | |
|---|---|
| *H01L 23/498* | (2006.01) |
| *H01L 21/66* | (2006.01) |
| *H01L 23/00* | (2006.01) |
| *H01L 23/49* | (2006.01) |
| *H01L 25/07* | (2006.01) |
| *H01L 23/538* | (2006.01) |

(52) U.S. Cl.
CPC ........ *H01L 23/49838* (2013.01); *H01L 22/32* (2013.01); *H01L 23/49* (2013.01); *H01L 23/4985* (2013.01); *H01L 24/32* (2013.01); *H01L 25/072* (2013.01); *H01L 23/5383* (2013.01); *H01L 23/5386* (2013.01); *H01L 2224/32227* (2013.01); *H01L 2924/1426* (2013.01)

(58) Field of Classification Search
CPC ............... H01L 23/49838; H01L 22/32; H01L 23/4985; H01L 24/32; H01L 2924/1426; H01L 2224/32227; H01L 23/5383; H01L 23/5386; H01L 25/072; H01L 23/3121; H01L 23/49; G09G 3/30; G02F 1/1345; H05K 1/14
See application file for complete search history.

(56) References Cited

U.S. PATENT DOCUMENTS

| | | |
|---|---|---|
| 8,780,311 B2 | 7/2014 | Ogasawara et al. |
| 8,853,694 B2 | 10/2014 | Han et al. |
| 8,970,816 B2 | 3/2015 | Gotoh et al. |
| 9,812,084 B2 | 11/2017 | Kim et al. |

(Continued)

FOREIGN PATENT DOCUMENTS

| | | |
|---|---|---|
| JP | 2013134265 | 7/2013 |
| KR | 100644846 | 11/2006 |

*Primary Examiner* — Ahmed N Sefer
(74) *Attorney, Agent, or Firm* — Myers Bigel, P.A.

(57) ABSTRACT

A chip-on-film package includes a base film having a top surface and a bottom surface, and a circuit region; a source driver chip and a gate driver chip mounted on the circuit region; a first conductive line on the top surface of the base film, a second conductive line on the bottom surface of the base film, and a conductive via that connects the first and second conductive lines to each other; a first row of bonding pads on the circuit region and connected to the source driver chip; a second row of bonding pads on the circuit region and connected to the source driver chip and the gate driver chip; and a test pad outside the circuit region and connected to the first and second conductive lines and the conductive via.

20 Claims, 14 Drawing Sheets

(56) References Cited

U.S. PATENT DOCUMENTS

| | | | |
|---|---|---|---|
| 10,177,175 B2 | 1/2019 | Kawamura et al. | |
| 2002/0180686 A1* | 12/2002 | Yuda | G09G 3/3611 |
| | | | 345/103 |
| 2008/0007683 A1 | 1/2008 | Makida | |
| 2013/0175528 A1* | 7/2013 | Han | H01L 23/49524 |
| | | | 257/E23.021 |
| 2013/0186680 A1* | 7/2013 | Ha | H01L 23/4985 |
| | | | 174/265 |
| 2016/0165718 A1* | 6/2016 | Oh | H01L 27/1218 |
| | | | 361/749 |
| 2016/0300545 A1* | 10/2016 | Kim | G09G 3/006 |
| 2016/0343279 A1* | 11/2016 | Oke | G09G 3/006 |
| 2016/0379906 A1* | 12/2016 | Kim | G09G 3/3688 |
| | | | 257/48 |
| 2017/0154939 A1* | 6/2017 | Song | H01L 27/3262 |
| 2018/0049324 A1* | 2/2018 | Koo | H01L 25/0655 |
| 2018/0076234 A1* | 3/2018 | Kim | H01L 24/06 |
| 2019/0088584 A1* | 3/2019 | Won | H01L 23/4985 |
| 2019/0164877 A1* | 5/2019 | Cho | H01L 23/49811 |
| 2019/0189058 A1* | 6/2019 | Cho | G09G 3/3688 |
| 2019/0198582 A1* | 6/2019 | Yeo | H01L 27/3276 |
| 2019/0244906 A1* | 8/2019 | Min | H01L 23/49811 |
| 2019/0326267 A1* | 10/2019 | Han | H01L 21/76877 |
| 2019/0348357 A1* | 11/2019 | Lee | H05K 1/0268 |

\* cited by examiner

CHIP-ON-FILM PACKAGES AND DISPLAY APPARATUSES INCLUDING THE SAME

CROSS-REFERENCE TO RELATED APPLICATION

This application claims the benefit of Korean Patent Application No. 10-2019-0112367, filed on Sep. 10, 2019, in the Korean Intellectual Property Office, the disclosure of which is incorporated herein in its entirety by reference.

BACKGROUND

The present disclosure relates to a chip-on-film (COF) package and a display apparatus including the same, and more particularly, to a COF package in which different types of semiconductor chips are arranged and a display apparatus including the COF package.

A chip-on-film (COF) package may include a semiconductor chip mounted on a base film, and the semiconductor chip may be electrically connected to an external apparatus through a conductive line and a conductive pad connected to the conductive line in the base film. In recent years, as bezel downscaling and panel thinning in display apparatuses have been increasingly demanded, the types and number of semiconductor chips mounted in one COF package have been gradually increased.

SUMMARY

The inventive concept provides a new arrangement of conductive lines and conductive pads to ensure a predetermined bonding pitch in one chip-on-film (COF) package in which different types of semiconductor chips are arranged.

The technical objectives of the inventive concept are not limited to the above and other objectives may become apparent to those of ordinary skill in the art based on the following descriptions.

According to an aspect of the inventive concept, there is provided a COF package including a base film having a top surface and a bottom surface that are opposite to each other, and further having a circuit region. The COF package includes a source driver chip and a gate driver chip mounted on the circuit region on the top surface of the base film, a first conductive line on the top surface of the base film, a second conductive line on the bottom surface of the base film, and a conductive via that connects the first and second conductive lines to each other. Moreover, the COF package includes a first row of bonding pads on the circuit region on the top surface of the base film and connected to the source driver chip, a second row of bonding pads on the circuit region on the top surface of the base film and connected to the source driver chip and the gate driver chip, and a test pad outside the circuit region on the top surface of the base film and connected to the first and second conductive lines and the conductive via.

According to another aspect of the inventive concept, there is provided a COF package including a base film having a top surface and a bottom surface that are opposite to each other, the base film further having a circuit region. The COF package includes a source driver chip and a gate driver chip mounted on the circuit region on the top surface of the base film, a first conductive line on the top surface of the base film, a second conductive line on the bottom surface of the base film, and a conductive via that connects the first and second conductive lines to each other. Moreover, the COF package includes a first row of bonding pads on the circuit region on the bottom surface of the base film and connected to the gate driver chip, a second row of bonding pads on the circuit region on the bottom surface of the base film and connected to the source driver chip, and a test pad outside the circuit region of the bottom surface of the base film and connected to the first and second conductive lines and the conductive via.

According to another aspect of the inventive concept, there is provided a display apparatus including a COF package having a base film, a display panel that faces a portion of a top surface of the base film, and a driver printed circuit board (PCB) that faces another portion of the top surface of the base film. The COF package includes the base film, a source driver chip and a gate driver chip mounted on the top surface of the base film, a first conductive line on the top surface of the base film, a second conductive line on a bottom surface of the base film, and a conductive via that connects the first and second conductive line. Moreover, the COF package includes a first row of bonding pads on the top surface of the base film and connected to the source driver chip, and a second row of bonding pads on the top surface of the base film and connected to the source driver chip and the gate driver chip.

According to another aspect of the inventive concept, there is provided a display apparatus including a COF package having a base film, a display panel that faces a portion of a bottom surface of the base film, and a driver PCB that faces a portion of a top surface of the base film. The COF package includes the base film, a source driver chip and a gate driver chip mounted on the top surface of the base film, a first conductive line on the top surface of the base film, a second conductive line on the bottom surface of the base film, and a conductive via that connects the first and second conductive lines to each other. Moreover, the COF package includes a first row of bonding pads on the bottom surface of the base film and connected to the gate driver chip, and a second row of bonding pads on the bottom surface of the base film and connected to the source driver chip.

BRIEF DESCRIPTION OF THE DRAWINGS

Embodiments of the inventive concept will be more clearly understood from the following detailed description taken in conjunction with the accompanying drawings in which.

DETAILED DESCRIPTION

Hereinafter, embodiments will be described in detail with reference to the accompanying drawings.

Figure 1:
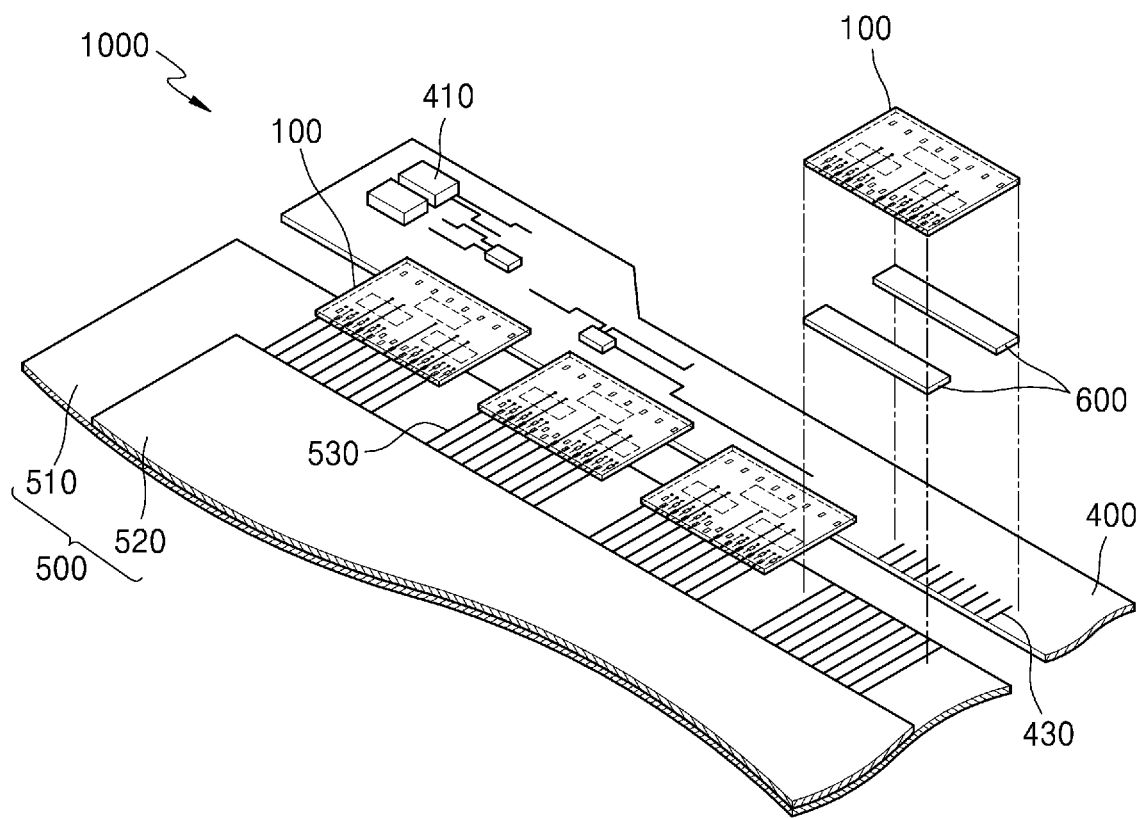
FIG. 1 is a schematic perspective view of a display apparatus including a chip-on-film (COF) package according to an embodiment.

FIG. 1 is a schematic perspective view of a display apparatus 1000 including a chip-on-film (COF) package according to an embodiment.

Referring to FIG. 1, the display apparatus 1000 may include at least one COF package 100, a driver printed circuit board (PCB) 400, and a display panel 500.

The COF package 100 may be a package including a semiconductor chip. A display chip may be a display driver IC (DDI). Different types of semiconductor chips may be arranged on the at least one COF package 100. For example, the semiconductor chip may include a source driver chip and a gate driver chip.

The COF package 100 may be located between the driver PCB 400 and the display panel 500 and connected to each of the driver PCB 400 and the display panel 500. The COF package 100 may receive a signal output by the driver PCB 400 and transmit the signal to the display panel 500.

At least one driver circuit chip 410 may be mounted on the driver PCB 400. The at least one driver circuit chip 410 may simultaneously or sequentially apply power and a signal to the COF package 100.

The display panel 500 may be, for example, a liquid crystal display (LCD) panel, a light emitting diode (LED) panel, an organic LED (OLED) panel, and a plasma display panel (PDP).

The COF package 100 may be electrically connected to a driver interconnection line 430 of the driver PCB 400 and a panel interconnection line 530 of the display panel 500.

In some embodiments, one COF package 100 may be connected between the driver PCB 400 and the display panel 500. For example, when the display panel 500 provides a small-area screen for a small-sized device (e.g., a mobile phone) or supports a relatively low resolution, the display apparatus 1000 may include only one COF package 100.

In other embodiments, a plurality of COF packages 100 may be connected between the driver PCB 400 and the display panel 500. For example, when the display panel 500 provides a large-area screen for a large-sized device (e.g., a television) or supports a relatively high resolution, the display apparatus 1000 may include a plurality of COF packages 100.

The COF package 100 may be connected only to one side of the display panel 500. However, the inventive concept is not limited thereto, and in some embodiments, at least one COF package 100 may be connected to each of at least two sides of the display panel 500.

The display panel 500 may include a transparent substrate 510 and an image region 520 and the panel interconnection line 530, which are formed on the transparent substrate 510. The transparent substrate 510 may be, for example, a glass substrate or a transparent flexible substrate. A plurality of pixels included in the image region 520 may be connected to a plurality of panel interconnection lines 530 corresponding thereto, and operate in response to signals provided by the semiconductor chip mounted on the COF package 100.

An input pad may be formed at one end of the COF package 100, and an output pad may be formed at another end thereof. The input pad and the output pad may be respectively connected to the driver interconnection line 430 of the driver PCB 400 and the panel interconnection line 530 of the display panel 500 by an anisotropic conductive layer 600.

The anisotropic conductive layer 600 may include, for example, an anisotropic conductive film or an anisotropic conductive paste. The anisotropic conductive layer 600 may have a structure in which conductive particles are distributed in an insulating adhesive layer. Also, the anisotropic conductive layer 600 may have anisotropic electrical characteristics so that the anisotropic conductive layer 600 may be insulated in a first direction (e.g., an X direction (FIG. 2A)) between adjacent electrodes while enabling the formation of an electrical conduction path only in a second direction (e.g., a Z direction (FIG. 2A)) of electrodes during the connection. When an adhesive is melted by applying heat and pressure to the anisotropic conductive layer 600, the conductive particles may be arranged between opposite electrodes, for example, between the input pad and the driver interconnection line 430 and between the output pad and the panel interconnection line 530 to form an electrical conduction path between the opposite electrodes, while the adhesive may be filled between the adjacent electrodes to insulate the adjacent electrodes from each other.

Hereinafter, the COF package 100 according to the present embodiment will be described in detail.

FIGS. 2A to 2E are schematic diagrams of a COF package 100 according to an embodiment.

Figure 2A:
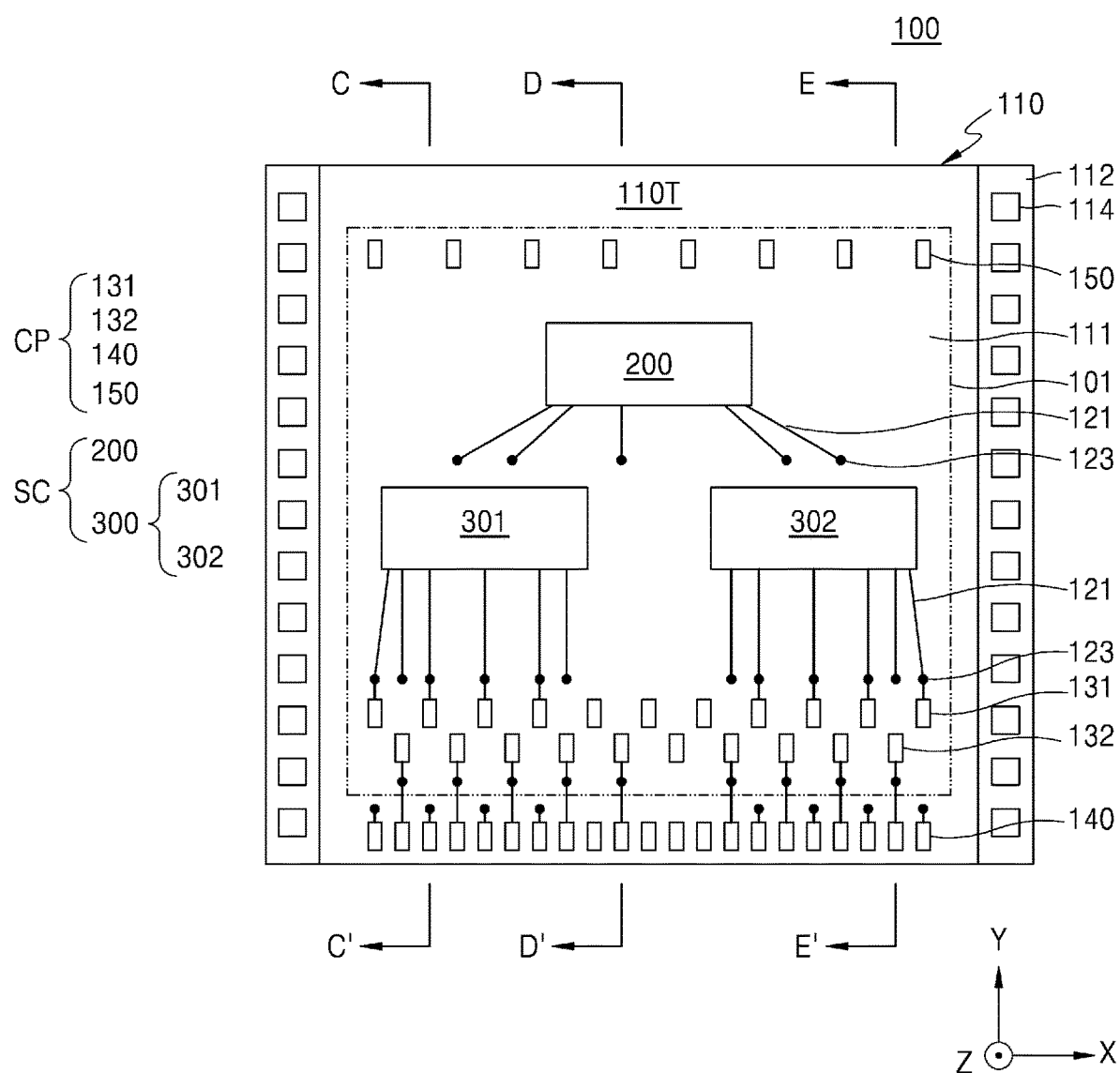
FIGS. 2A to 2E are schematic diagrams of a COF package according to an embodiment.
Figure 2B:
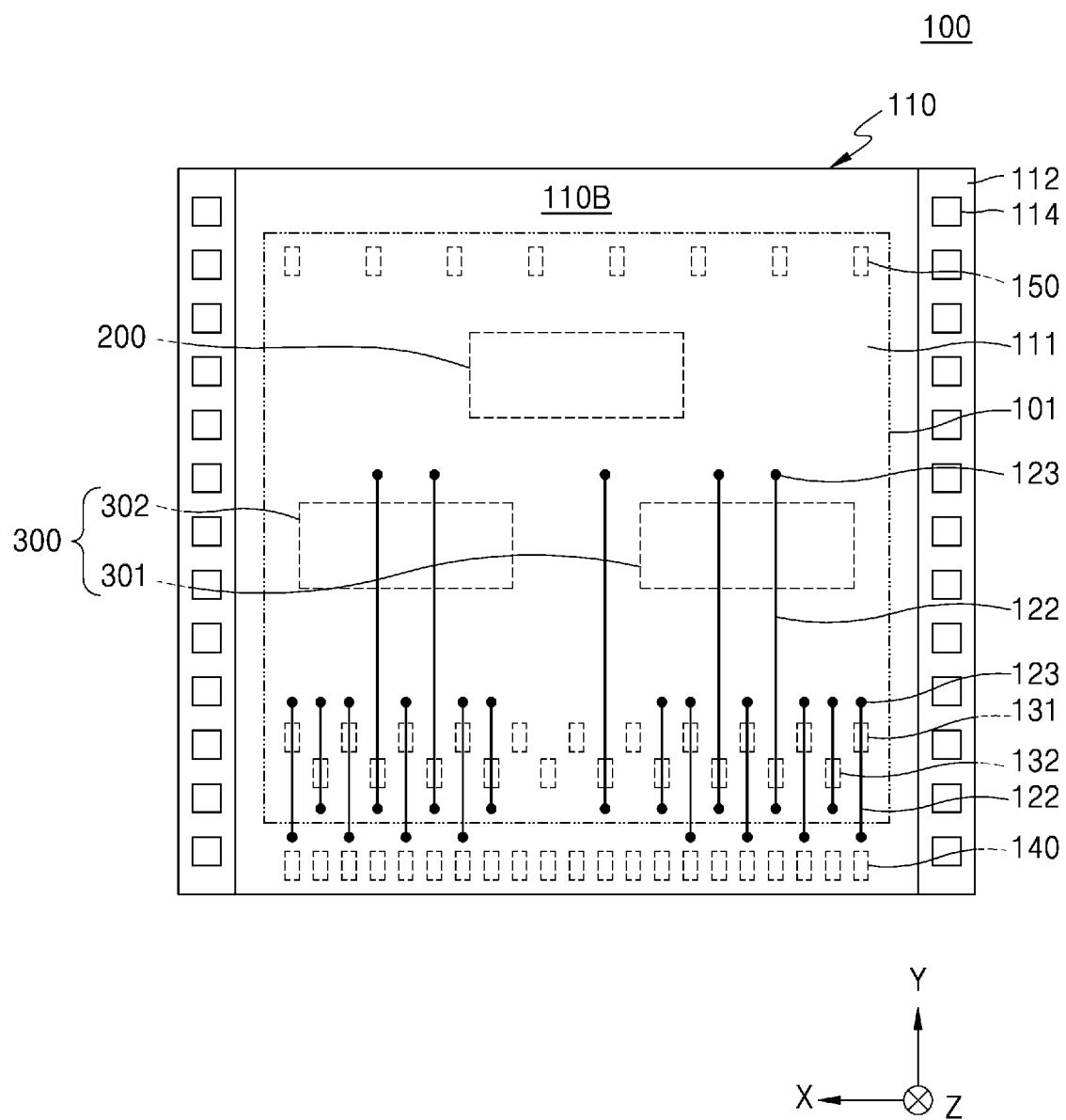
Figure 2C:
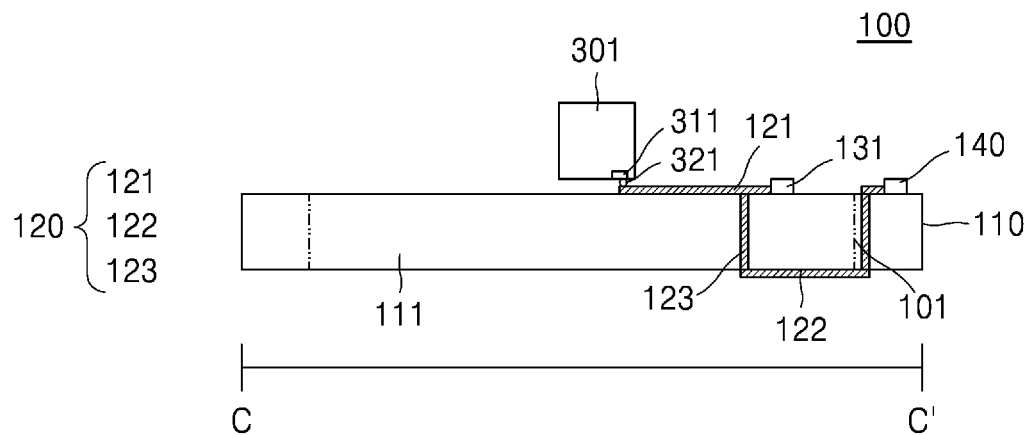
Figure 2D:
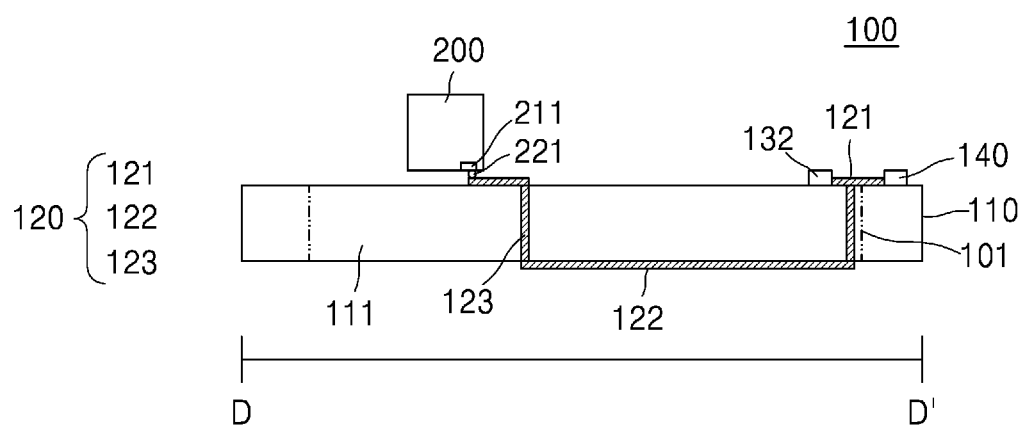
Figure 2E:
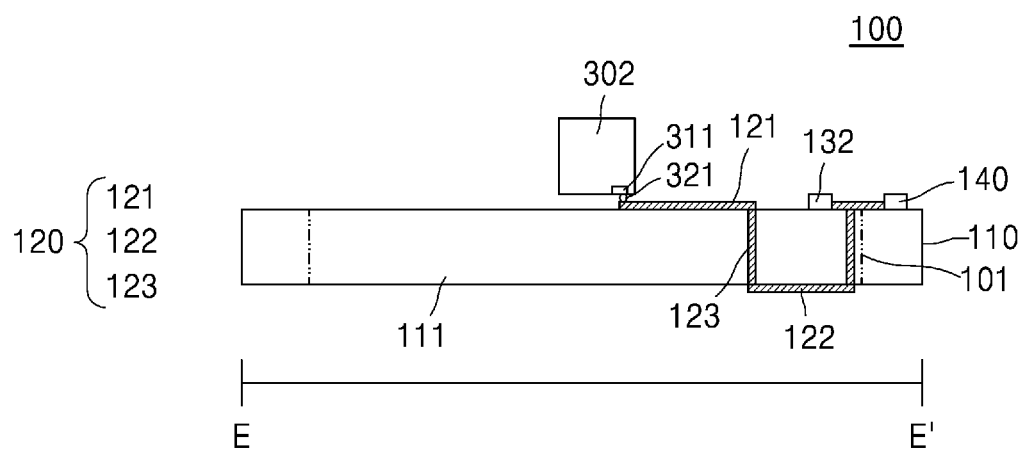

Specifically, FIG. 2A is a plan view of the COF package 100, and FIG. 2B is a bottom view of the COF package 100. Also, FIG. 2C is a cross-sectional view taken along line C-C' of FIG. 2A, FIG. 2D is a cross-sectional view taken along line D-D' of FIG. 2A, and FIG. 2E is a cross-sectional view taken along line E-E' of FIG. 2A.

Referring to FIGS. 2A to 2E, the COF package 100 may include a base film 110, a conductive interconnection 120 and a conductive pad CP, which are formed in the base film 110, and a semiconductor chip SC mounted on the base film 110.

The base film 110 may be a flexible film including polyimide, which is a material having a high coefficient of thermal expansion and a high durability. A material for the base film 110 is not limited thereto and may include, for example, synthetic resins, such as an epoxy resin, acryl, polyether nitrile, polyether sulfone, polyethylene terephthalate, and polyethylene naphthalate.

The base film 110 may include a circuit region 111 confined inside a cutting line 101 and perforation (PF) regions 112 located at both side ends of the base film 110. The circuit region 111 may be a region in which the semiconductor chip SC is mounted. In some embodiments, the cutting line 101 may be an imaginary boundary/partition line.

The PF regions 112 may be located at both side ends of the base film 110 and include a plurality of PF holes 114. Reeling of the base film 110 around a winding reel (not shown) and releasing the base film 110 from the winding reel may be controlled by the PF holes 114.

In general, since the PF holes 114 are arranged at a constant pitch, a length of the base film 110 may be determined by the number of PF holes 114. Meanwhile, a width and the length of the base film 110 may be determined by the number and size of semiconductor chips SC mounted on the base film 110 and structures of the conductive interconnection 120 and the conductive pad CP, which are formed in the base film 110.

Although not shown, a protective layer may be formed on a top surface 110T and a bottom surface 110B of the base film 110 to protect/prevent the conductive interconnection 120 from being physically and/or chemically damaged due to external factors. The protective layer may cover the conductive interconnection 120 formed on the top surface 110T and the bottom surface 110B of the base film 110 while exposing a predetermined portion of the conductive interconnection 120. The protective layer may include, for example, solder resist or dry film resist. Alternatively, the protective layer may include a typical insulating film including silicon oxide or silicon nitride.

The conductive interconnection 120 may include a first conductive line 121, a second conductive line 122, and a conductive via 123. The conductive interconnection 120 may include, for example, aluminium foil or copper foil. In some embodiments, the conductive interconnection 120 may be formed by patterning a metal layer formed on the base film 110 using, for example, a casting process, a laminating process, or an electroplating process.

The conductive interconnection 120 may include the first conductive line 121, which is formed on the top surface 110T of the base film 110, and the second conductive line 122, which is formed on the bottom surface 110B of the base film 110. That is, the conductive interconnection 120 may be formed on both the top surface 110T and the bottom surface 110B of the base film 110. Also, the conductive interconnection 120 may include the conductive via 123, which passes through the base film 110 and electrically connects the first conductive line 121 to the second conductive line 122. In some embodiments, a portion of the first conductive line 121 (e.g., a portion adjacent a bonding pad 131 or 132) on the top surface 110T of the base film 110 may overlap, in the Z direction, a portion of the second conductive line 122 on the bottom surface 110B of the base film 110.

The conductive pad CP may be formed at each of portions adjacent to edges of one end and another end of the base film 110 and connected to the conductive interconnection 120. The conductive pad CP may be formed on the top surface 110T of the base film 110.

The conductive pad CP may include a first row bonding pad 131 and a second row bonding pad 132, which are connected to a display panel (refer to 500 in FIG. 1), driver PCB 400, a driver connection pad 150, which is connected to a driver PCB (refer to 400 in FIG. 1), and a test pad 140 configured to test the conductive interconnection 120. As used herein, the terms "first row bonding pad" and "second row bonding pad" may refer to first and second rows, respectively, of bonding pads.

The conductive pad CP may be a first portion of the conductive interconnection 120 or a second portion of the conductive interconnection 120 that is plated with tin (Sb), gold (Au), nickel (Ni), or lead (Pb). In some embodiments, the conductive pad CP may be electrically connected to the conductive interconnection 120 and include a conductive material that is separately formed.

The semiconductor chip SC may be a DDI used to drive a display. For example, the semiconductor chip SC may be a source driver chip 300 configured to generate an image signal using a data signal transmitted from a timing controller and output the image signal to the display panel (refer to 500 in FIG. 1). Alternatively, the semiconductor chip SC may be a gate driver chip 200 configured to output a scan signal including an on/off signal of a transistor to the display panel (refer to 500 in FIG. 1).

Although one gate driver chip 200 and two source driver chips 300 are illustrated, types and the number of the semiconductor chips SC are not limited thereto. However, the number of source driver chips 300 may be greater than or equal to the number of gate driver chips 200 in view of characteristics of a display apparatus (refer to 1000 in FIG. 1).

The semiconductor chip SC is not limited to the gate driver chip 200 or the source driver chip 300. For example, when the COF package 100 is combined with an electronic device other than the display apparatus 1000, the semiconductor chip SC may be a chip configured to drive the corresponding electronic device.

The semiconductor chip SC may be disposed in the circuit region 111 of the base film 110 and mounted on the base film 110 using a flip-chip bonding process. In other words, a connection terminal 221 (FIG. 2D), such as a solder ball, may be arranged on a chip pad 211 (FIG. 2D) that is exposed at an active surface of the gate driver chip 200, and a connection terminal 321 (FIG. 2C), such as a solder ball, may be arranged on a chip pad 311 (FIG. 2C) that is exposed at an active surface of each of a plurality of source driver chips 300. Also, the connection terminals 221 and 321 may be physically and electrically combined with the conductive interconnection 120, and thus, the gate driver chip 200 and the plurality of source driver chips 300 may be mounted on the base film 110.

A portion of the chip pad 211 of the gate driver chip 200 and a portion of the chip pad 311 of each of the plurality of source driver chips 300 may serve as input terminals, and another portion of the chip pad 211 of the gate driver chip 200 and another portion of the chip pad 311 of each of the plurality of source driver chips 300 may serve as output terminals.

Although not shown, the semiconductor chip SC may be sealed with a sealing member to protect/prevent the semiconductor chip SC from being physically and/or chemically damaged due to external factors. Furthermore, an underfill (not shown) may be filled between the semiconductor chip SC and the base film 110. The underfill may be formed using, for example, a capillary underfill process. The underfill may include, for example, an epoxy resin, but the inventive concept is not limited thereto.

In recent years, as the downscaling of a bezel and the thinning of a panel have been increasingly demanded in the display apparatus 1000, types and the number of semiconductor chips SC mounted in one COF package 100 are showing a tendency to gradually increase. Thus, the numbers of conductive interconnections 120 and conductive pads CP, which are connected to the semiconductor chips SC, may also increase. Accordingly, the efficient arrangement of the conductive interconnections 120 and the conductive pads CP at a predetermined bonding pitch in a limited circuit region 111 of the base film 110 may significantly affect improvements in the productivity and economical efficiency of the COF package 100.

As used herein, a bonding pitch may refer to a distance measured between two corresponding points of neighboring conductive interconnections 120 in a direction perpendicular to a lengthwise direction of the conductive interconnections 120, or a distance measured between two corresponding central points of neighboring conductive pads CP. For instance, the bonding pitch may refer to a distance between centers of two neighboring first conductive lines 121, which is measured in an X direction, or a distance between centers of two neighboring first row bonding pads 131, which is measured in the X direction.

Accordingly, the COF package 100 according to the present embodiment may propose a new design for implementing the conductive interconnection 120 and the conductive pad CP, which have a predetermined bonding pitch, while arranging different types of semiconductor chips SC, that is, at least one gate driver chip 200 and at least two source driver chips 300, on the base film 110.

To this end, the conductive pad CP connected to the display panel (refer to 500 in FIG. 1) may include the first row bonding pad 131 and the second row bonding pad 132. Here, the conductive interconnection 120 may be configured such that the first row bonding pad 131 is connected (e.g., electrically connected) only to the source driver chip 300, and the conductive interconnection 120 may be configured such that the second row bonding pad 132 is connected (e.g., electrically connected) to both the gate driver chip 200 and the source driver chip 300. For example, the second row of bonding pads 132 may include a first bonding pad 132 that is electrically connected to the gate driver chip 200 through a first conductive via 123, and may further include a second bonding pad 132 that is electrically connected to the source driver chip 300 through a second conductive via 123.

A distance between the first row bonding pad 131 and the source driver chip 300 may be less than a distance between the second row bonding pad 132 and the source driver chip 300, and the first row bonding pad 131 and the second row bonding pad 132 may be arranged in zigzag in X and Y directions. Accordingly, the first row bonding pad 131 and the second row bonding pad 132 may not be collinear in the Y direction in which they are spaced apart from the source driver chip 300.

The source driver chip 300 may include a first source driver chip 301 and a second source driver chip 302. The first source driver chip 301 may have some signal connections to the first row bonding pad 131 and have some other signal connections to the second row bonding pad 132. Similarly, the second source driver chip 302 may have some signal connections to the first row bonding pad 131 and have some other signal connections to the second row bonding pad 132.

A connection relationship between the source driver chip 300 and the first and second row bonding pads 131 and 132 will now be described in detail. To begin with, the first row bonding pad 131 may be connected (e.g., electrically connected) to the source driver chip 300 through the first conductive line 121 (i.e., through the top surface 110T of the base film 110) without passing through the conductive via 123. Next, the second row bonding pad 132 may be indirectly connected (e.g., electrically connected) to the source driver chip 300 through a first conductive via 123, which is arranged between the first row bonding pad 131 and the source driver chip 300, and a second conductive via 123, which is arranged between the second row bonding pad 132 and the cutting line 101 that is close to the second row bonding pad 132.

Unlike the source driver chip 300, the gate driver chip 200 may have all signal connections to the second row bonding pad 132.

A connection relationship between the gate driver chip 200 and the second row bonding pad 132 will now be described in detail. The second row bonding pad 132 may be indirectly connected (e.g., electrically connected) to the gate driver chip 200 through a first conductive via 123, which is arranged between the gate driver chip 200 and the source driver chip 300, and a second conductive via 123, which is arranged between the second row bonding pad 132 and the cutting line 101 that is close to the second row bonding pad 132.

That is, in view of the configuration of the semiconductor chip SC, the source driver chips 300, which may use a relatively large number of conductive pads CP for signal connection and are provided in a relatively large number, may exclusively use the first row bonding pad 131, and additional conductive pads CP may use a portion of the second row bonding pad 132. In this case, since the first conductive line 121 configured to connect the source driver chip 300 to the first row bonding pad 131 is formed on the top surface 110T of the base film 110, the first conductive line 121 may be relatively free in an arrangement relationship with the second conductive line 122 formed on the bottom surface 110B of the base film 110. In addition, since the source driver chip 300 is located a relatively small distance from the first row bonding pad 131 and the first conductive line 121 is formed in a straight shape, a routing path may be reduced/minimized, thus facilitating fast signal transmission. That is, the conductive interconnection 120 may be designed to have a predetermined bonding pitch on the top surface 110T of the base film 110.

Furthermore, in view of the configuration of the semiconductor chip SC, the gate driver chips 200, which use a relatively small number of conductive pads CP for signal connection and are provided in a relatively small number, may use the remaining portion of the second row bonding pad 132. In this case, since the second conductive line 122 configured to connect the gate driver chip 200 to the second row bonding pad 132 is formed on the bottom surface 110B of the base film 110, the second conductive line 122 may be relatively free in an arrangement relationship with the first conductive line 121 formed on the top surface 110T of the base film 110. Although a portion of the second row bonding pad 132 is electrically connected to the source driver chip 300, may signal connections of the source driver chip 300 may use the first row bonding pad 131. That is, the conductive interconnection 120 may be designed to have a predetermined bonding pitch on the bottom surface 110B of the base film 110.

Unlike a typical memory semiconductor package, the COF package 100 may include the test pad 140 formed in the base film 110. The test pad 140 may be used to test a connection failure, such as short circuits in the first conductive line 121, the second conductive line 122, and the conductive via 123. However, since the test pad 140 may play an immaterial role after checking a test result and determining whether the COF package 100 has a connection failure, the test pad 140 may be arranged outside the cutting line 101 (i.e., outside the circuit region 111).

The test pad 140 configured to test the conductive interconnection 120, which connects the source driver chip 300 to the first row bonding pad 131, may be arranged on the top surface 110T of the base film 110. From among the conductive vias 123, a conductive via 123 arranged between the second row bonding pad 132 and the test pad 140 may be arranged outside the circuit region 111. That is, the COF package 100 may be designed to reduce/minimize the number of conductive vias 123 arranged in the circuit region 111 such that the conductive interconnection 120 has a predetermined bonding pitch.

In addition, the test pad 140 configured to test the conductive interconnection 120, which connects the gate driver chip 200 to the second row bonding pad 132, may be arranged on the top surface 110T of the base film 110.

In some embodiments, the test pad 140 may be arranged only in a region adjacent to the second row bonding pad 132. In other words, the test pad 140 may be arranged only in a region adjacent to one edge of the base film 110. However, the arrangement of the test pad 140 is not limited thereto.

As a result, in the COF package 100 according to the present embodiment, while arranging at least one gate driver chip 200 and at least two source driver chips 300 on the base film 110, the conductive interconnection 120 and the conductive pad CP, which have a predetermined bonding pitch, may be designed not to intersect or overlap each other, and the test pad 140 configured to test the conductive interconnection 120 may be arranged so as not to affect routing. Thus, the productivity and economical efficiency of the COF package 100 may be improved.

Figure 3:
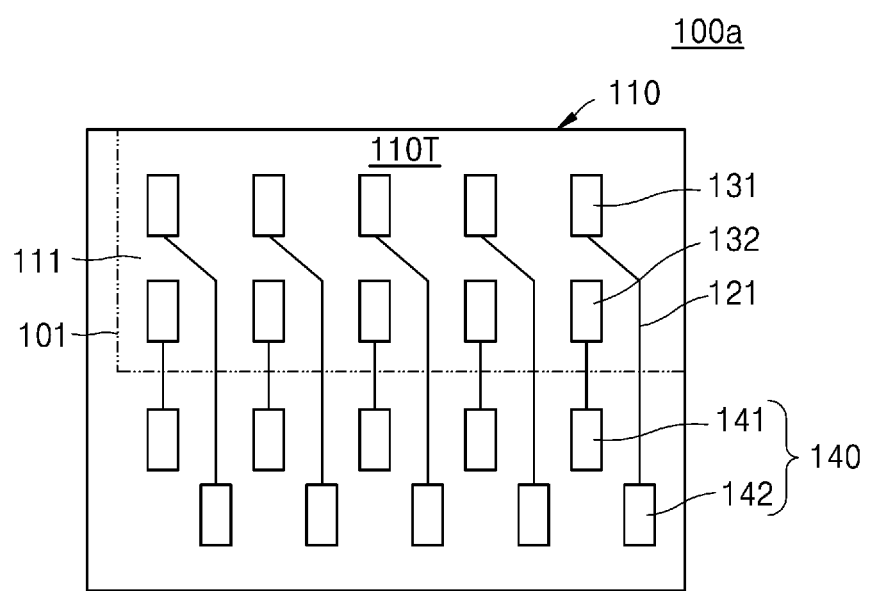
FIG. 3 is a schematic plan view of a portion of a COF package according to an embodiment.

FIG. 3 is a schematic plan view of a portion of a COF package 100a according to an embodiment.

Most components included in the COF package 100a that will be described below and materials included in the components are substantially the same as or similar to those described with reference to FIGS. 2A to 2E. Thus, differences between the COF package 100a according to the present embodiment and the COF package (refer to 100 in FIG. 2A) described above may mainly be described for brevity.

FIG. 3 illustrates first and second row bonding pads 131 and 132 and a test pad 140, which is electrically connected to the first and second row bonding pads 131 and 132 through a first conductive line 121, at a top surface 110T of a base film 110.

The test pad 140 may include a first row test pad 141 and a second row test pad 142. A distance between the first row test pad 141 and the second row bonding pad 132 may be less than a distance between the second row test pad 142 and the second row bonding pad 132, and the first row test pad 141 and the second row test pad 142 may be arranged in zigzag in X and Y directions.

Since the first and second row test pads 141 and 142 may play immaterial roles after checking a test result and determining a connection failure in the COF package 100a, the first and second row test pads 141 and 142 may be arranged outside a cutting line 101 (i.e., outside a circuit region 111).

The first row bonding pad 131 and the second row bonding pad 132 may be arranged in parallel in an X direction (e.g., may be collinear in a Y direction). That is, unlike the first and second row test pads 141 and 142, the first row bonding pad 131 and the second row bonding pad 132 may not be arranged in zigzag in the X and Y directions.

Thus, the first row bonding pad 131 may be connected to the second row test pad 142 through the first conductive line 121, and the second row bonding pad 132 may be connected to the first row test pad 141 through the first conductive line 121.

Also, the first conductive line 121 configured to connect the first row bonding pad 131 to the second row test pad 142 may have at least one bent portion, and the first conductive line 121 configured connect the second row bonding pad 132 to the first row test pad 141 may have a straight shape.

Although not shown, in other embodiments, the first row bonding pad 131 and the second row bonding pad 132 may be arranged in zigzag in the X and Y directions. In this case, the first row test pads 141 and the second row test pads 142 may be arranged in parallel in the X direction (e.g., may be collinear in the Y direction). That is, the first row test pad 141 and the second row test pad 142 may not be arranged in zigzag in the X and Y directions.

Figure 4:
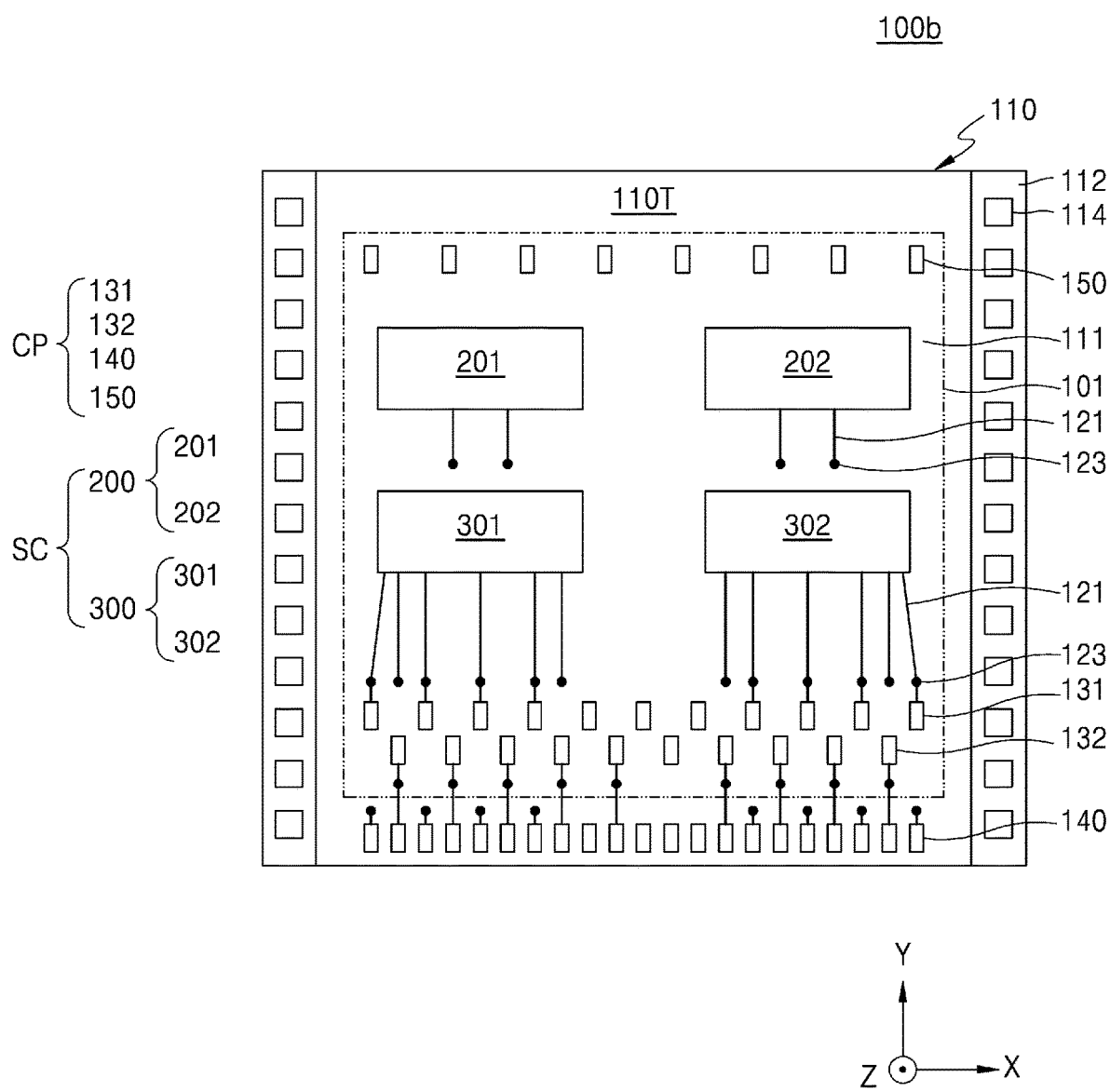
FIG. 4 is a schematic plan view of a COF package according to an embodiment.

FIG. 4 is a schematic plan view of a COF package 100b according to an embodiment.

Most components included in the COF package 100b that will be described below and materials included in the components are substantially the same as or similar to those described with reference to FIGS. 2A to 2E. Thus, differences between the COF package 100b according to the present embodiment and the COF package (refer to 100 in FIG. 2A) described above may mainly be described for brevity.

Referring to FIG. 4, the COF package 100b may include a base film 110, a conductive interconnection 120 and a conductive pad CP, which are formed in the base film 110, and a semiconductor chip SC mounted on the base film 110.

Although one gate driver chip 200 and two source driver chips 300 are illustrated, types and the number of the semiconductor chips SC are not limited thereto. However, the number of source driver chips 300 may be greater than or equal to the number of gate driver chips 200 in view of characteristics of a display apparatus (refer to 1000 in FIG. 1).

The gate driver chip 200 may include a first gate driver chip 201 and a second gate driver chip 202. The first gate driver chip 201 may have a signal connection to the second row bonding pad 132. Similarly, the second gate driver chip 202 may have a signal connection to the second row bonding pad 132.

The gate driver chip 200 and the source driver chip 300 may be arranged in parallel in an X direction (e.g., may be collinear in a Y direction). Also, the gate driver chip 200 may be arranged a predetermined distance apart from the source driver chip 300 in the Y direction.

A connection relationship between the first gate driver chip 201 and the second row bonding pad 132 will now be described in detail. The second row bonding pad 132 may be indirectly connected to the first gate driver chip 201 through a first conductive via 123, which is arranged between the first gate driver chip 201 and a first source driver chip 301, and a second conductive via 123, which is arranged between the second row bonding pad 132 and a cutting line 101 that is close to the second row bonding pad 132.

A connection relationship between the second gate driver chip 202 and the second row bonding pad 132 will now be described in detail. The second row bonding pad 132 may be indirectly connected to the second gate driver chip 202 through a first conductive via 123, which is arranged between the second gate driver chip 202 and a second source driver chip 302, and a second conductive via 123, which is arranged between the second row bonding pad 132 and the cutting line 101 that is close to the second row bonding pad 132.

The COF package 100b according to the present embodiment may propose a new design for implementing the conductive interconnection 120 and the conductive pad CP, which have a predetermined bonding pitch, while arranging at least two gate driver chips 200 and at least two source driver chips 300 on the base film 110.

FIGS. 5A to 5E are schematic diagrams of a COF package 100c according to an embodiment.

Figure 5A:
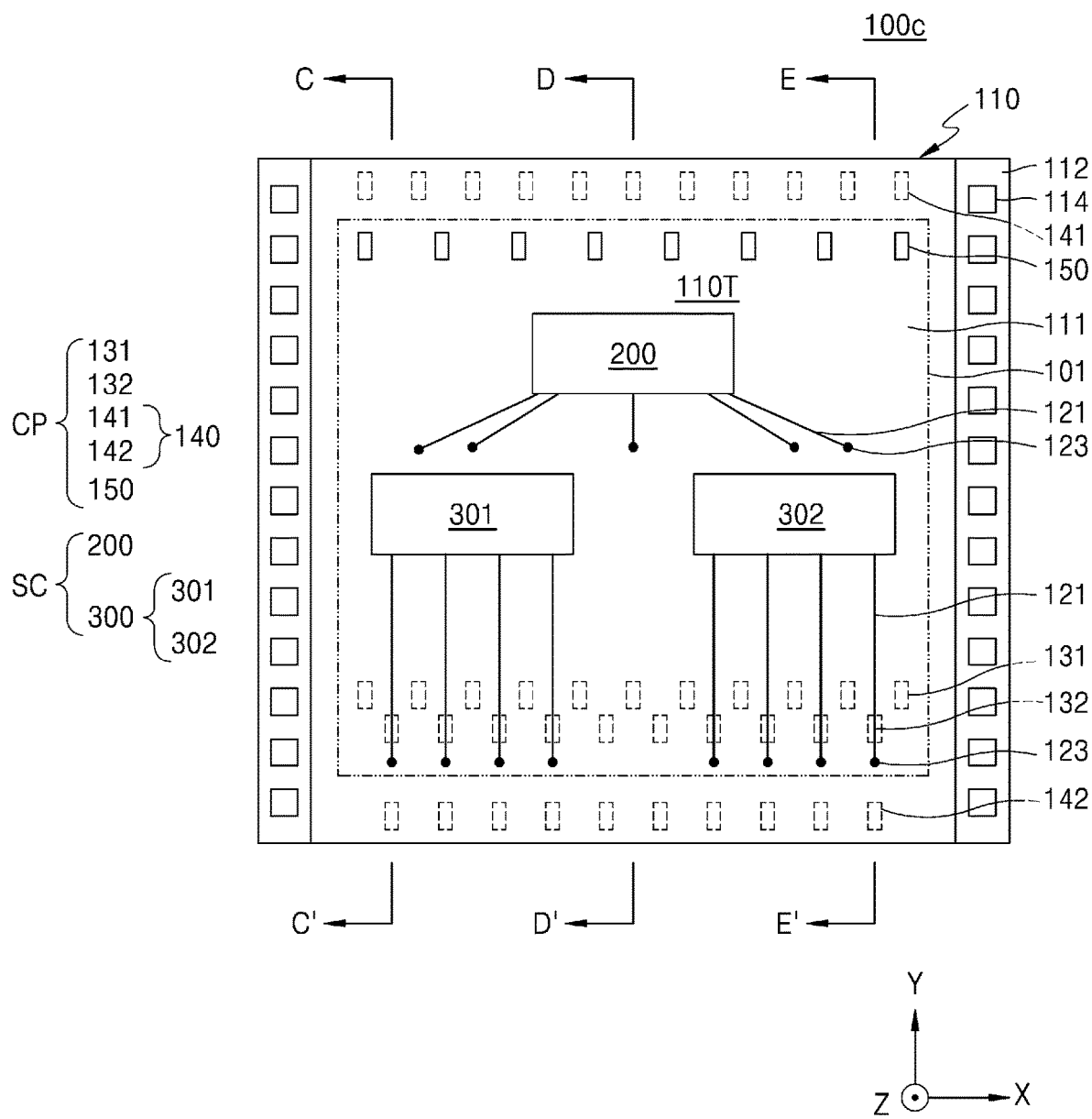
FIGS. 5A to 5E are schematic diagrams of a COF package according to an embodiment.
Figure 5B:
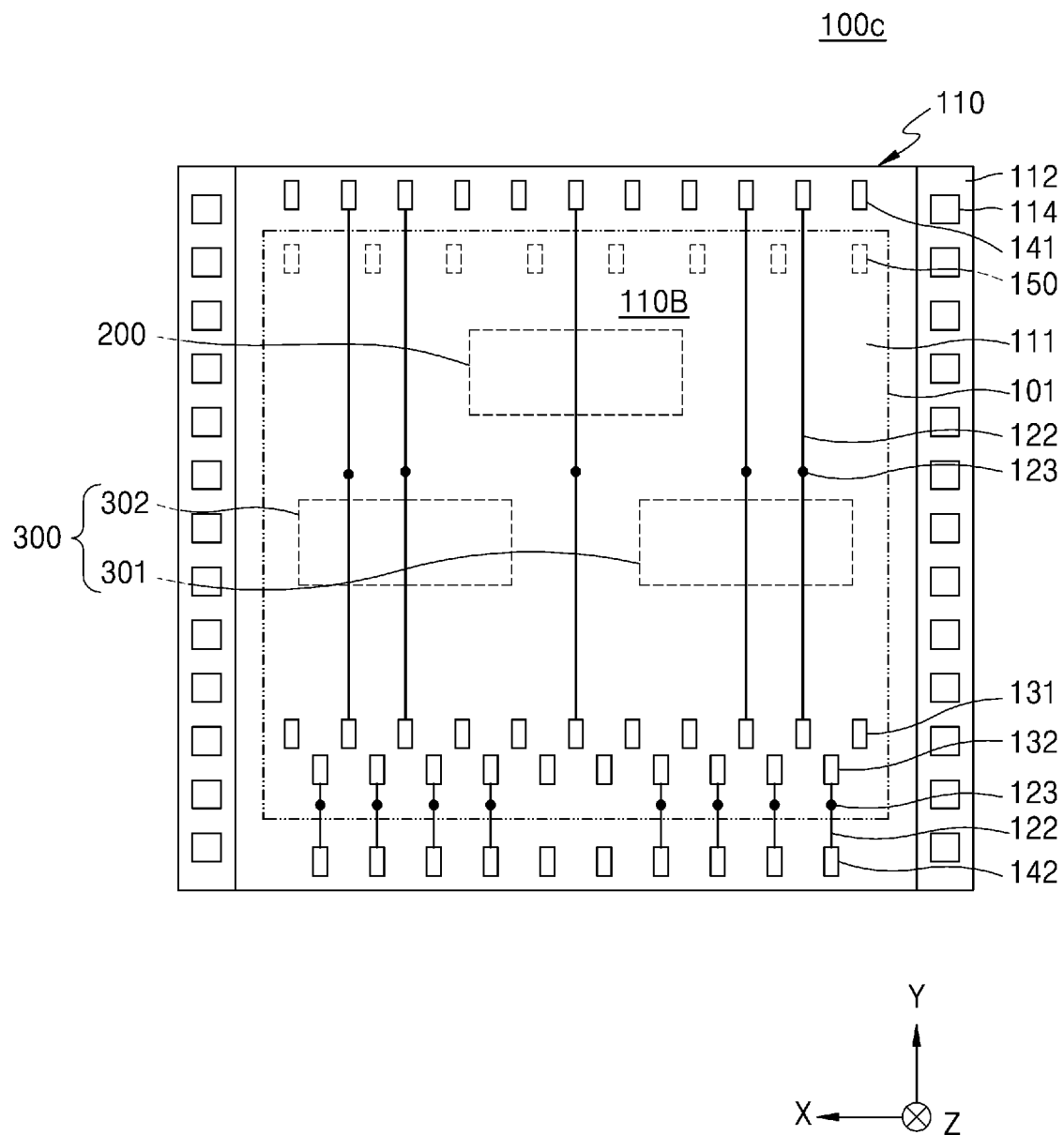
Figure 5C:
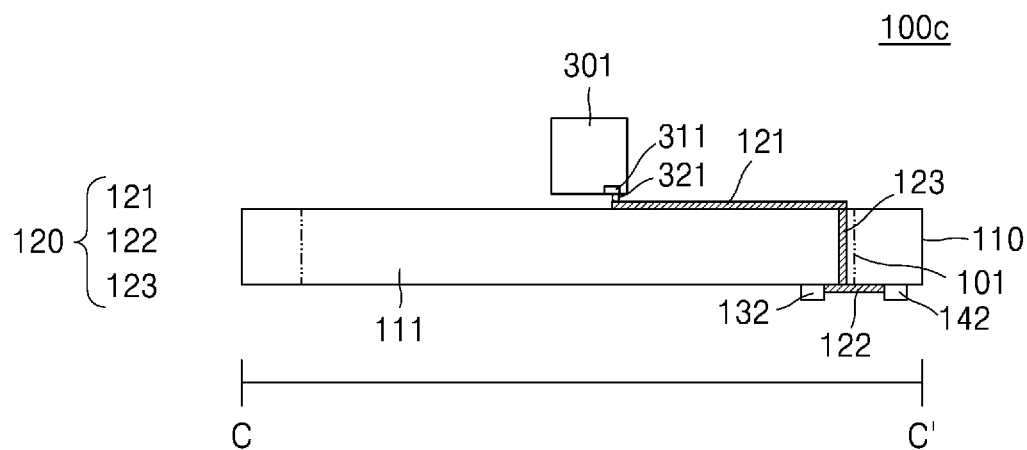
Figure 5D:
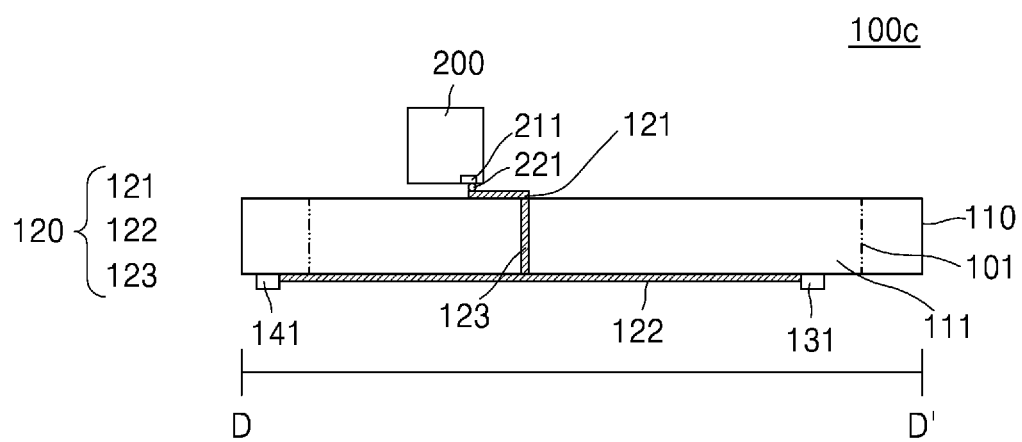
Figure 5E:
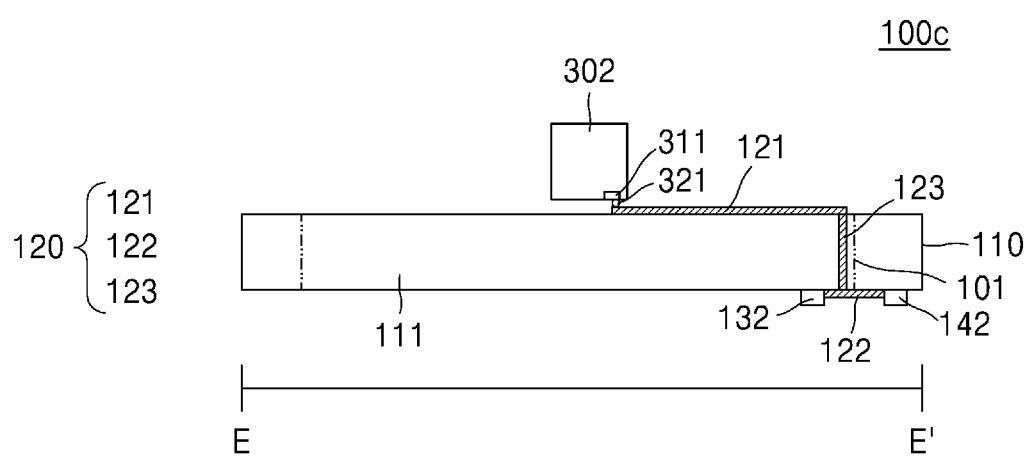

Specifically, FIG. 5A is a plan view of the COF package 100c, and FIG. 5B is a bottom view of the COF package 100c. Also, FIG. 5C is a cross-sectional view taken along line C-C' of FIG. 5A, FIG. 5D is a cross-sectional view taken along line D-D' of FIG. 5A, and FIG. 5E is a cross-sectional view taken along line E-E' of FIG. 5A.

Most components included in the COF package 100c that will be described below and materials included in the components are substantially the same as or similar to those described with reference to FIGS. 2A to 2E. Thus, differences between the COF package 100c according to the present embodiment and the COF package (refer to 100 in FIG. 2A) described above may mainly be described for brevity.

Referring to FIGS. 5A to 5E, the COF package 100c may include a base film 110, a conductive interconnection 120 and a conductive pad CP, which are formed in the base film 110, and a semiconductor chip SC mounted on the base film 110.

The conductive interconnection 120 may include a first conductive line 121, a second conductive line 122, and a conductive via 123. The conductive interconnection 120 may include the first conductive line 121, which is formed on a top surface 110T of the base film 110, and the second conductive line 122, which is formed on a bottom surface 110B of the base film 110. That is, the conductive interconnection 120 may be formed on both the top surface 110T and the bottom surface 110B of the base film 110. Also, the conductive interconnection 120 may include the conductive via 123, which passes through the base film 110 and electrically connects the first conductive line 121 to the second conductive line 122.

The conductive pad CP may be formed at each of portions adjacent to edges of one end and another end of the base film 110 and connected to the conductive interconnection 120. The conductive pad CP may be formed on the top surface 110T or the bottom surface 110B of the base film 110. Specifically, a driver connection pad 150 may be arranged on the top surface 110T of the base film 110 and connected to a driver PCB (refer to 400 in FIG. 1). First and second row bonding pads 131 and 132 and first and second row test pads 141 and 142 may be provided on the bottom surface 110B of the base film 110. The first and second row bonding pads 131 and 132 may be connected to a display panel (refer to 500 in FIG. 1), and the first and second row test pads 141 and 142 may be used to test the conductive interconnection 120.

The COF package 100c according to the present embodiment may propose a new design for implementing the conductive interconnection 120 and the conductive pad CP, which have a predetermined bonding pitch, while arranging at least one gate driver chip 200 and at least two source driver chips 300 on the base film 110.

Although one gate driver chip 200 and two source driver chips 300 are illustrated, the inventive concept is not limited thereto. However, the number of source driver chips 300 may be greater than or equal to the number of gate driver chips 200 in view of characteristics of a display apparatus (refer to 1000 in FIG. 1).

The conductive pad CP connected to a display panel (refer to 500 in FIG. 1) may include the first row bonding pad 131 and the second row bonding pad 132. Both the first row bonding pad 131 and the second row bonding pad 132 may be arranged on the bottom surface 110B of the base film 110.

Here, the conductive interconnection 120 may be configured such that the first row bonding pad 131 is connected only to the gate driver chip 200, and the conductive interconnection 120 may be connected such that the second row bonding pad 132 is connected only to the source driver chip 300.

A distance between the first row bonding pad 131 and the source driver chip 300 may be less than a distance between the second row bonding pad 132 and the source driver chip 300, and the first row bonding pad 131 and the second row bonding pad 132 may be arranged in zigzag in X and Y directions.

The source driver chip 300 may include a first source driver chip 301 and a second source driver chip 302. The first source driver chip 301 may have a signal connection only to the second row bonding pad 132. Similarly, the second source driver chip 302 may have a signal connection only to the second row bonding pad 132.

A connection relationship between the source driver chip 300 and the second row bonding pad 132 will now be described in detail. The source driver chip 300 may have all signal connections to the second row bonding pad 132. The second row bonding pad 132 may be connected to the source driver chip 300 through the first conductive line 121 and the conductive via 123, which is arranged between the second row bonding pad 132 and a cutting line 101 that is close to the second row bonding pad 132.

Also, a connection relationship between the gate driver chip 200 and the first row bonding pad 131 will now be described in detail. The gate driver chip 200 may have all signal connections to the first row bonding pad 131. The first row bonding pad 131 may be connected to the gate driver chip 200 through the second conductive line 122 and the conductive via 123, which is arranged between the gate driver chip 200 and the source driver chip 300.

That is, in view of the configuration of the semiconductor chip SC, the source driver chips 300, which use a relatively large number of conductive pads CP for signal connection and are provided in a relatively large number, may exclusively use the second row bonding pad 132. In this case, since the first conductive line 121 configured to connect the source driver chip 300 to the second row bonding pad 132 is formed on the top surface 110T of the base film 110, the first conductive line 121 may be relatively free in an arrangement relationship with the second conductive line 122 formed on the bottom surface 110B of the base film 110.

Furthermore, in view of the configuration of the semiconductor chip SC, the gate driver chips 200, which may use a relatively small number of conductive pads CP for signal connection and are provided in a relatively small number, may exclusively use the first row bonding pad 131. In this case, since the second conductive line 122 configured to connect the gate driver chip 200 to the first row bonding pad 131 is formed on the bottom surface 110B of the base film 110, the second conductive line 122 may be relatively free in an arrangement relationship with the first conductive line 121 formed on the top surface 110T of the base film 110. Here, some of the first row bonding pads 131 may be formed as dummy pads that are not connected to the first conductive line 121 and the second conductive line 122. Thus, the dummy pads may provide free spaces for arranging the conductive interconnections 120 and the conductive pads CP at a predetermined bonding pitch.

Unlike a typical memory semiconductor package, the COF package 100c may include a test pad 140 formed in the base film 110. The test pad 140 may be used to test a connection failure, such as short circuits in the first conductive line 121, the second conductive line 122, and the conductive via 123. However, since the test pad 140 may play an immaterial role after checking a test result and determining a connection failure in the COF package 100c, the test pad 140 may be arranged outside the cutting line 101 (i.e., outside a circuit region).

The second row test pad 142 configured to test the conductive interconnection 120, which connects the source driver chip 300 to the second row bonding pad 132, may be arranged on the bottom surface 110B of the base film 110. Similarly, the first row test pad 141 configured to test the conductive interconnection 120, which connects the gate driver chip 200 to the first row bonding pad 131, may be arranged on the bottom surface 110B of the base film 110.

In some embodiments, the first row test pad 141 connected to the first row bonding pad 131 may be arranged in a region adjacent to the driver connection pad 150. Also, the second row test pad 142 connected to the second row bonding pad 132 may be arranged in a region adjacent to the second row bonding pad 132. In other words, the test pad 140 may be divided and arranged in regions adjacent to two opposite edges of the base film 110. However, the arrangement of the test pad 140 is not limited thereto.

As a result, in the COF package 100c according to the present embodiment, while arranging at least one gate driver chip 200 and at least two source driver chips 300 on the base film 110, the conductive interconnection 120 and the conductive pad CP, which have a predetermined bonding pitch, may be designed not to intersect or overlap each other, and the test pad 140 configured to test the conductive interconnection 120 may be arranged so as not to affect routing. Thus, the productivity and economical efficiency of the COF package 100c may be improved.

Figure 6:
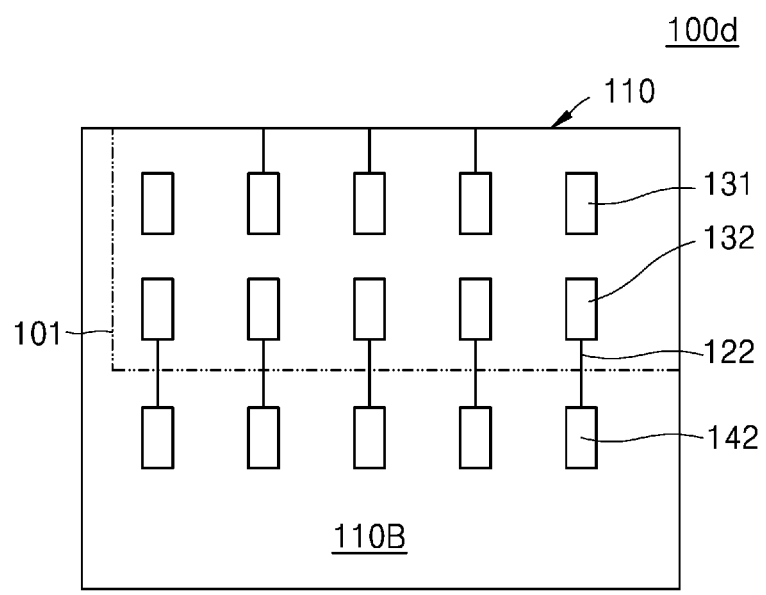
FIG. 6 is a schematic plan view of a portion of a COF package according to an embodiment.

FIG. 6 is a schematic plan view of a portion of a COF package 100d according to an embodiment.

Most components included in the COF package 100d that will be described below and materials included in the components are substantially the same as or similar to those described with reference to FIGS. 5A to 5E. Thus, differences between the COF package 100d according to the present embodiment and the COF package (refer to 100c in FIG. 5A) described above may mainly be described for brevity.

FIG. 6 illustrates a second row test pad 142, which is electrically connected to a second row bonding pad 132 through a second conductive line 122 at a bottom surface 110B of a base film 110.

A test pad (refer to 140 in FIG. 5A) may include a first row test pad (refer to 141 in FIG. 5A) and a second row test pad 142. A distance between the second row test pad 142 and the second row bonding pad 132 may be less than a distance between the second row test pad 142 and a first row bonding pad 131, and the first row test pad 141 and the second row test pad 142 may be separately arranged in different regions of the base film 110.

Since the second row test pad 142 may play an immaterial role after checking a test result and determining whether the COF package 100d has a connection failure, the second row test pad 142 may be arranged outside a cutting line 101 (i.e., outside a circuit region).

The first row bonding pad 131 and the second row bonding pad 132 may be arranged in parallel in an X direction (e.g., may be collinear in a Y direction). That is, the first row bonding pad 131 and the second row bonding pad 132 may not be arranged in zigzag in X and Y directions.

The first row bonding pad 131 may be electrically connected to the first row test pad 141 by one second conductive line 122, and the second row bonding pad 132 may be electrically connected to the second row test pad 142 by another second conductive line 122. Also, each of the second conductive line 122 configured to connect the first row bonding pad 131 to the first row test pad 141 and the second conductive line 122 configured to connect the second row bonding pad 132 to the second row test pad 142 may have a straight shape.

Although not shown, in other embodiments, the first row bonding pad 131 and the second row bonding pad 132 may be arranged in zigzag in X and Y directions.

Figure 7:
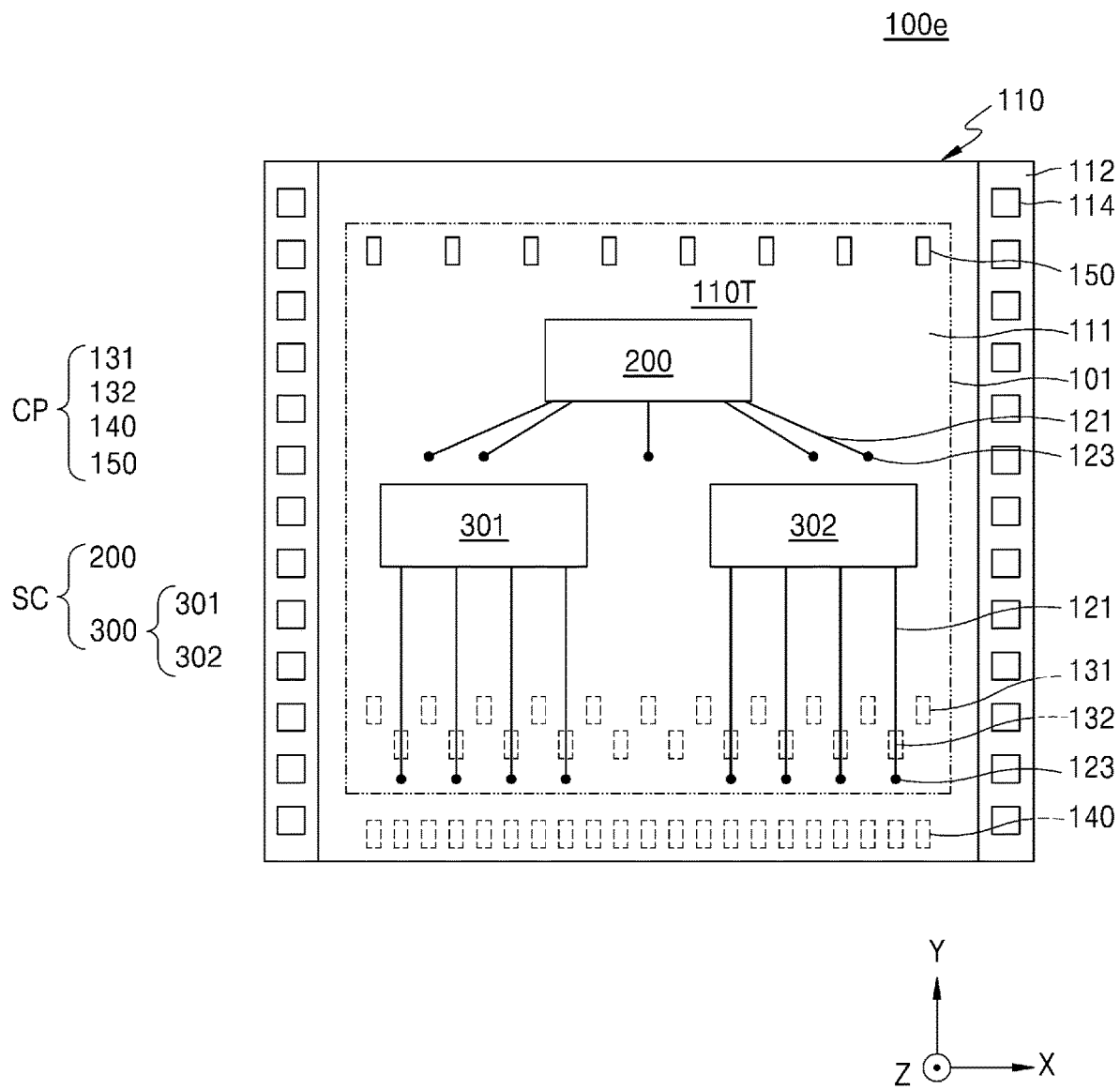
FIG. 7 is a schematic plan view of a COF package according to an embodiment.

FIG. 7 is a schematic plan view of a COF package 100e according to an embodiment.

Most components included in the COF package 100e that will be described below and materials included in the components are substantially the same as or similar to those described with reference to FIGS. 5A to 5E. Thus, differences between the COF package 100e according to the present embodiment and the COF package (refer to 100c in FIG. 5A) described above may mainly be described for brevity.

FIG. 7 illustrates a test pad 140, which is electrically connected to first and second row bonding pads 131 and 132 through a second conductive line 122 and formed on a bottom surface 110B of a base film 110.

Unlike a typical memory semiconductor package, the COF package 100e may include the test pad 140 in the base film 110. The test pad 140 may be used to test a connection failure, such as short circuits in the first conductive line 121, the second conductive line 122, and the conductive via 123. However, since the test pad 140 may play an immaterial role after checking a test result and determining whether the COF package 100e has a connection failure, the test pad 140 may be arranged outside a cutting line 101 (i.e., outside a circuit region).

A test pad 140 configured to test a conductive interconnection 120, which connects a source driver chip 300 to the second row bonding pad 132, may be arranged on the bottom surface 110B of the base film 110. Similarly, a test pad 140 configured to test a conductive interconnection 120, which connects a gate driver chip 200 to the first row bonding pad 131, may be arranged on the bottom surface 110B of the base film 110.

In some embodiments, the test pad 140 may be arranged only in a region adjacent to the second row bonding pad 132. In other words, the test pad 140 configured to test the first and second row bonding pads 131 and 132 may not be divided but arranged only in a region adjacent to one edge of the base film 110. However, the arrangement of the test pad 140 is not limited thereto.

Figure 8:
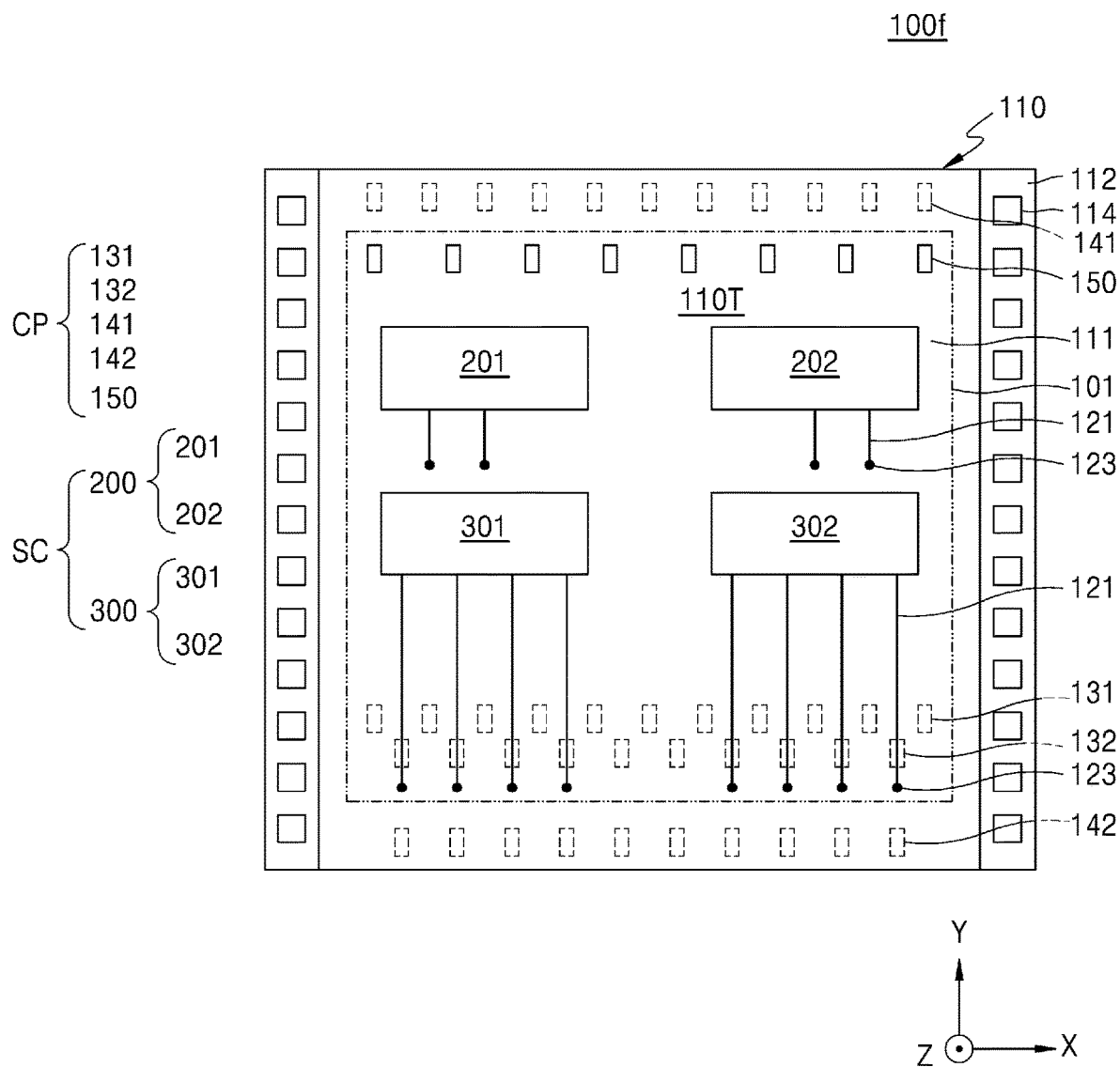
FIG. 8 is a schematic plan view of a COF package according to an embodiment.

FIG. 8 is a schematic plan view of a COF package 100f according to an embodiment.

Most components included in the COF package 100f that will be described below and materials included in the components are substantially the same as or similar to those described with reference to FIGS. 5A to 5E. Thus, differences between the COF package 100f according to the present embodiment and the COF package (refer to 100c in FIG. 5A) described above may mainly be described for brevity.

Referring to FIG. 8, the COF package 100f may include a base film 110, a conductive interconnection 120 and a conductive pad CP, which are formed in the base film 110, and a semiconductor chip SC mounted on the base film 110.

Although two gate driver chips 200 and two source driver chips 300 are illustrated in FIG. 8, the inventive concept is not limited thereto. However, the number of source driver chips 300 may be greater than or equal to the number of gate driver chips 200 in view of characteristics of a display apparatus (refer to 1000 in FIG. 1).

The gate driver chip 200 may include a first gate driver chip 201 and a second gate driver chip 202. The first gate driver chip 201 may have a signal connection only to a first row bonding pad 131. Similarly, the second gate driver chip 202 may have a signal connection only to the first row bonding pad 131.

The gate driver chip 200 and the source driver chip 300 may be arranged in parallel in an X direction (e.g., may be collinear in a Y direction). Also, the gate driver chip 200 may be arranged a predetermined distance apart from the source driver chip 300 in the Y direction.

A connection relationship between the first gate driver chip 201 and the first row bonding pad 131 will now be described in detail. The first row bonding pad 131 may be connected to the first gate driver chip 201 through a second conductive line 122 and a conductive via 123, which is arranged between the first gate driver chip 201 and a first source driver chip 301.

A connection relationship between the second gate driver chip 202 and a second row bonding pad 132 will now be described in detail. The first row bonding pad 131 may be connected to the second gate driver chip 202 through the second conductive line 122 and the conductive via 123, which is arranged between the second gate driver chip 202 and a second source driver chip 302.

The COF package 100f according to the present embodiment may propose a new design for implementing the conductive interconnection 120 and the conductive pad CP, which have a predetermined bonding pitch, while arranging at least two gate driver chips 200 and at least two source driver chips 300 on the base film 110.

Figure 9A:
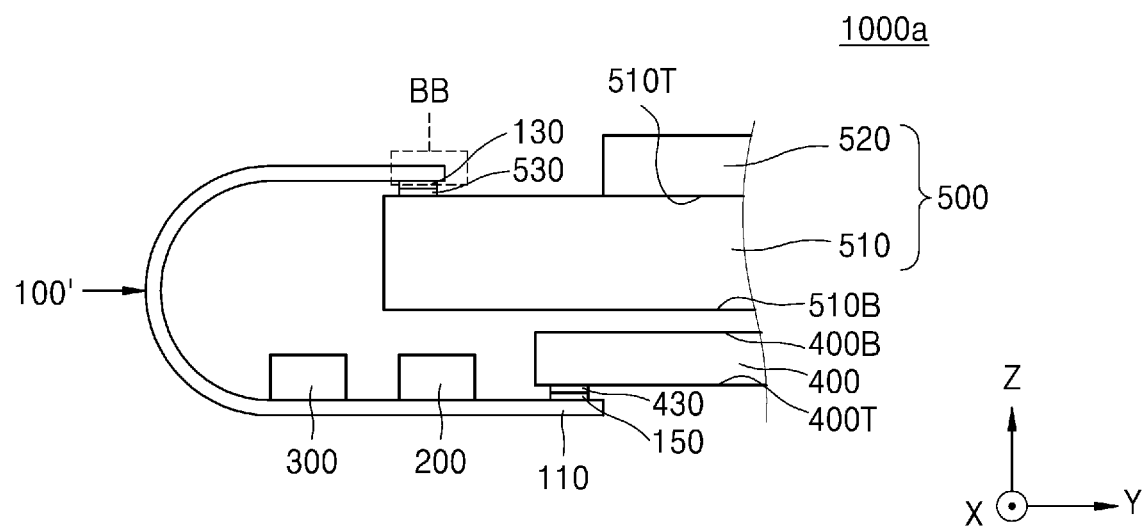
FIGS. 9A and 9B are schematic diagrams of a display apparatus including a COF package according to an embodiment.
Figure 9B:
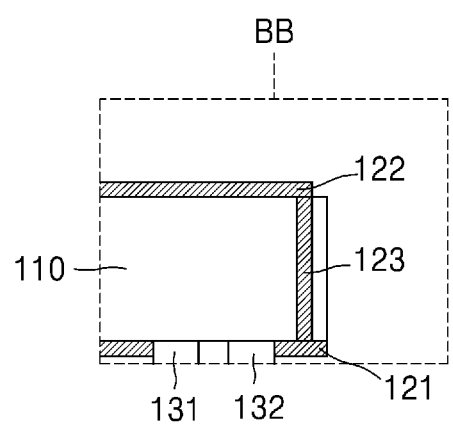

FIGS. 9A and 9B are schematic diagrams of a display apparatus 1000a including a COF package 100' according to an embodiment.

Specifically, FIG. 9A is a cross-sectional view of the display apparatus 1000a, and FIG. 9B is a partial enlarged view of a region BB of FIG. 9A.

Referring to FIGS. 9A and 9B, the display apparatus 1000a may include the COF package 100', a driver PCB 400, and a display panel 500.

The display panel 500 may include a transparent substrate 510 and an image region 520 and a plurality of panel interconnection lines 530, which are formed on the transparent substrate 510. In some embodiments, the image region 520 and the plurality of panel interconnection lines 530 may be formed on a front surface 510T of the transparent substrate 510. A plurality pixels included in the image region 520 may be connected to the plurality of panel interconnection lines 530.

Here, the COF package 100' may refer to only a portion of a circuit region 111, which is cut along a cutting line 101 in the COF package 100 described above with reference to FIGS. 2A to 2E.

A portion of the COF package 100' may face a portion of the display panel 500. Specifically, a portion of a base film 110 on which a bonding pad 130 is arranged may be opposite to a portion of the front surface 510T of the transparent substrate 510. The bonding pad 130 may include a first row bonding pad (refer to 131 in FIG. 2A) and a second row bonding pad (refer to 132 in FIG. 2A).

The COF package 100' may receive a signal output by the driver PCB 400 and transmit the signal to the display panel 500. At least one driver circuit chip (refer to 410 in FIG. 1) capable of simultaneously or sequentially applying power and a signal to the COF package 100' may be mounted on the driver PCB 400.

The COF package 100' may include a source driver chip 300, a gate driver chip 200, a first conductive line (refer to 121 in FIG. 2C) formed on a top surface of the base film 110, a second conductive line (refer to 122 in FIG. 2C) formed on a bottom surface of the base film 110, and a conductive via (refer to 123 in FIG. 2C) configured to connect the first and second conductive lines 121 and 122 to each other.

The display panel 500 may have the front surface 510T of the transparent substrate 510 on which the image region 520 including the plurality of pixels is arranged and a rear surface 510B that is opposite to the front surface 510T. The COF package 100' may be bent toward the rear surface 510B of the display panel 500 and fixed (i.e., attached) to the display panel 500, and the driver PCB 400 may face the rear surface 510B of the display panel 500.

The display apparatus 1000a according to the present embodiment may implement a conductive interconnection (refer to 120 in FIG. 2C) and a conductive pad (refer to CP in FIG. 2A), which have a predetermined bonding pitch, while arranging at least one gate driver chip 200 and at least two source driver chips 300 of the base film 110 of the COF package 100'. Thus, the productivity and economical efficiency of the display apparatus 1000a including the COF package 100' may be improved.

Figure 10A:
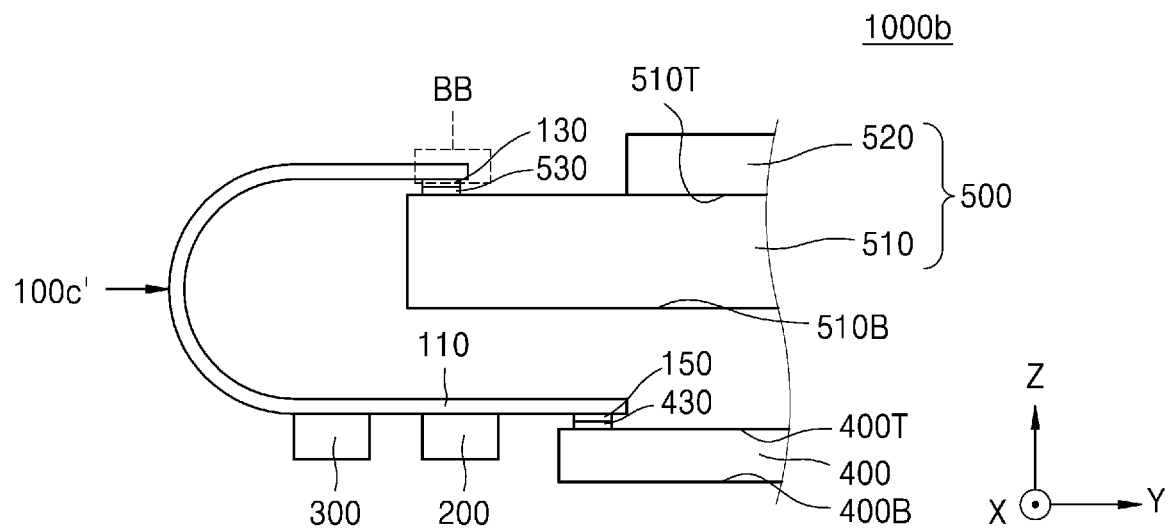
FIGS. 10A and 10B are schematic diagrams of a display apparatus including a COF package according to an embodiment.
Figure 10B:
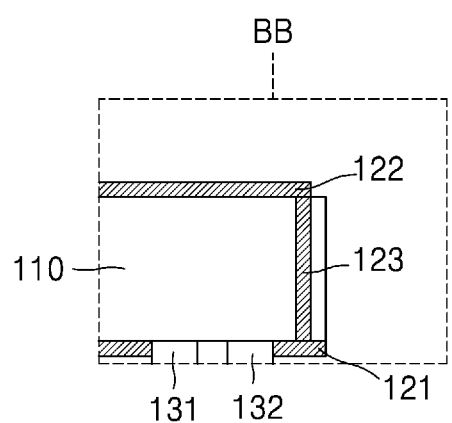

FIGS. 10A and 10B are schematic diagrams of a display apparatus 1000b including a COF package 100c' according to an embodiment.

Specifically, FIG. 10A is a cross-sectional view of the display apparatus 1000b, and FIG. 10B is a partial enlarged view of a region BB of FIG. 10A.

Referring to FIGS. 10A and 10B, the display apparatus 1000b may include the COF package 100c', a driver PCB 400, and a display panel 500.

The display panel 500 may include a transparent substrate 510 and an image region 520 and a plurality of panel interconnection lines 530 formed on the transparent substrate 510. In some embodiments, the image region 520 and the plurality of panel interconnection lines 530 may be formed on a front surface 510T of the transparent substrate 510. A plurality of pixels included in the image region 520 may be connected to the plurality of panel interconnection lines 530.

Here, the COF package 100c' may refer to only a portion of a circuit region 111, which is cut along a cutting line 101 in the COF package 100c described above with reference to FIGS. 5A to 5E.

A portion of the COF package 100c' may face a portion of the display panel 500. Specifically, a portion of a base film 110 on which a bonding pad 130 is arranged may be opposite to a portion of the front surface 510T of the transparent substrate 510. The bonding pad 130 may include a first row bonding pad (refer to 131 in FIG. 5A) and a second row bonding pad (refer to 132 in FIG. 5A).

The COF package 100c' may receive a signal output by the driver PCB 400 and transmit the signal to the display panel 500. At least one driver circuit chip (refer to 410 in FIG. 1) capable of simultaneously or sequentially applying power and a signal to the COF package 100c' may be mounted on the driver PCB 400.

The COF package 100c' may include a source driver chip 300, a gate driver chip 200, a first conductive line (refer to 121 in FIG. 5C) formed on a top surface of the base film 110, a second conductive line (refer to 122 in FIG. 5C) formed on a bottom surface of the base film 110, and a conductive via (refer to 123 in FIG. 5C) configured to connect the first and second conductive lines 121 and 122 to each other.

The display panel 500 may have the front surface 510T of the transparent substrate 510 on which the image region 520 including the plurality of pixels is arranged and a rear surface 510B that is opposite to the front surface 510T. The COF package 100c' may be bent toward the rear surface 510B of the display panel 500 and fixed to the display panel 500, and the driver PCB 400 may be arranged apart from the rear surface 510B of the display panel 500 with the COF package 100c' therebetween.

The display apparatus 1000b according to the present embodiment may implement a conductive interconnection (refer to 120 in FIG. 5C) and a conductive pad (refer to CP in FIG. 5A), which have a predetermined pitch, while arranging at least one gate driver chip 200 and at least two source driver chips 300 on the base film 110 of the COF package 100c'. Thus, the productivity and economical efficiency of the display apparatus 1000b including the COF package 100c' may be improved.

While the inventive concept has been particularly shown and described with reference to example embodiments thereof, it will be understood that various changes in form and details may be made therein without departing from the scope of the following claims.

What is claimed is:

1. A chip-on-film (COF) package comprising:
   a base film having a top surface and a bottom surface that are opposite to each other, and further having a circuit region;
   a source driver chip and a gate driver chip mounted on the circuit region on the top surface of the base film;
   a first conductive line on the top surface of the base film, a second conductive line on the bottom surface of the base film, and a conductive via that connects the first and second conductive lines to each other;
   a first row of bonding pads on the circuit region on the top surface of the base film and connected to the source driver chip;
   a second row of bonding pads on the circuit region on the top surface of the base film and connected to the source driver chip and the gate driver chip; and
   a test pad outside the circuit region on the top surface of the base film and connected to the first and second conductive lines and the conductive via.

2. The COF package of claim 1, wherein the conductive via is connected to the test pad outside the circuit region.

3. The COF package of claim 1,
   wherein the source driver chip comprises at least two source driver chips and the gate driver chip comprises at least one gate driver chip, and
   wherein the number of source driver chips is greater than or equal to the number of gate driver chips.

4. The COF package of claim 1,
   wherein a first distance between the first row of bonding pads and the source driver chip is less than a second distance between the second row of bonding pads and the source driver chip, and
   wherein the first row of bonding pads and the second row of bonding pads are in a zigzag arrangement.

5. The COF package of claim 1, wherein the first row of bonding pads is connected to the source driver chip through the first conductive line without passing through the conductive via.

6. The COF package of claim 1, wherein the second row of bonding pads is connected to the source driver chip through the conductive via.

7. The COF package of claim 1,
   wherein the second row of bonding pads is connected to the gate driver chip through the conductive via, and
   wherein the first conductive line is closer than the second conductive line to the second row of bonding pads.

8. The COF package of claim 1, wherein the test pad comprises a plurality of test pads, each of which is in a region adjacent to an edge of the base film.

9. The COF package of claim 1, wherein a portion of the first conductive line on the top surface of the base film overlaps a portion of the second conductive line on the bottom surface of the base film.

10. The COF package of claim 1, wherein the test pad is connected to the second row of bonding pads through the first conductive line.

11. A chip-on-film (COF) package comprising:
    a film having a top surface and a bottom surface that are opposite to each other;
    a source driver chip and a gate driver chip on the top surface of the film;
    a first conductive line on the top surface of the film, a second conductive line on the bottom surface of the film, and a conductive via that connects the first and second conductive lines to each other;
    a first row of bonding pads on the top surface of the film and connected to the source driver chip;
    a second row of bonding pads on the top surface of the film and connected to the source driver chip and the gate driver chip; and
    a test pad on the top surface of the film and connected to the first and second conductive lines and the conductive via, wherein the test pad is connected to the second row of bonding pads through the first conductive line.

12. The COF package of claim 11,
    wherein the source driver chip comprises at least two source driver chips and the gate driver chip comprises at least one gate driver chip, and
    wherein the number of source driver chips is greater than or equal to the number of gate driver chips.

13. The COF package of claim 11,
    wherein a first distance between the first row of bonding pads and the source driver chip is less than a second distance between the second row of bonding pads and the source driver chip, and
    wherein the first row of bonding pads and the second row of bonding pads are in a zigzag arrangement.

14. The COF package of claim 11, wherein the first row of bonding pads is connected to the source driver chip through the first conductive line without passing through the conductive via.

15. The COF package of claim 11, wherein the second row of bonding pads is connected to the source driver chip through the conductive via.

16. A chip-on-film (COF) package comprising:
    a film having a top surface and a bottom surface that are opposite to each other;
    a source driver chip and a gate driver chip on the top surface of the film;
    a first conductive line on the top surface of the film, a second conductive line on the bottom surface of the film, and a conductive via that connects the first and second conductive lines to each other;
    a first row of bonding pads on the top surface of the film and connected to the source driver chip;
    a second row of bonding pads on the top surface of the film and connected to the source driver chip and the gate driver chip; and
    a test pad on the top surface of the film and connected to the first and second conductive lines and the conductive via,
    wherein a first distance between the first row of bonding pads and the source driver chip is less than a second distance between the second row of bonding pads and the source driver chip.

17. The COF package of claim 16,
    wherein the source driver chip comprises at least two source driver chips and the gate driver chip comprises at least one gate driver chip, and
    wherein the number of source driver chips is greater than or equal to the number of gate driver chips.

18. The COF package of claim 16, wherein the first row of bonding pads and the second row of bonding pads are in a zigzag arrangement.

19. The COF package of claim 16, wherein the first row of bonding pads is connected to the source driver chip through the first conductive line and not through the conductive via.

20. The COF package of claim 16, wherein the second row of bonding pads is connected to the source driver chip through the conductive via.

* * * * *